United States Patent
Ahn et al.

(10) Patent No.: US 6,335,567 B1
(45) Date of Patent: Jan. 1, 2002

(54) SEMICONDUCTOR DEVICE HAVING STRESS REDUCING LAMINATE AND METHOD FOR MANUFACTURING THE SAME

(75) Inventors: Jong-hyon Ahn; Chang-hun Lee, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/348,830

(22) Filed: Jul. 8, 1999

(30) Foreign Application Priority Data

Oct. 7, 1998 (KR) .................................................. 98-41862

(51) Int. Cl.⁷ .......................... H01L 23/48; H01L 23/52; H01L 29/40
(52) U.S. Cl. ...................... 257/734; 257/750; 257/758; 257/774; 257/775
(58) Field of Search ..................... 257/734, 750, 257/758, 774, 775; 438/652, 118, 622, 629, 637, 639, 640, 667, 668, 672, 675, 700, 701, 713, 978, 638

(56) References Cited

U.S. PATENT DOCUMENTS

| | | | |
|---|---|---|---|
| 4,184,909 | * 1/1980 | Chang et al. | 257/774 |
| 5,609,775 | * 3/1997 | Liu | 156/643.1 |
| 5,616,519 | * 4/1997 | Ping | 438/626 |
| 5,747,380 | * 5/1998 | Yu et al. | 438/599 |
| 5,937,324 | * 8/1999 | Abercrombie et al. | 438/648 |
| 5,972,789 | * 10/1999 | Jeng et al. | 438/637 |
| 6,114,253 | * 9/2000 | Jang et al. | 438/725 |

FOREIGN PATENT DOCUMENTS 3-136351   6/1991   (JP) .

* cited by examiner

*Primary Examiner*—Jhihan B Clark
(74) *Attorney, Agent, or Firm*—Jones Volentine, PLLC

(57) ABSTRACT

A semiconductor device has a stress reducing laminate. Grooves are formed on the surface of a material layer selected from a multilayer structure of the semiconductor device, for example, a conductive layer. The cross sections of the grooves are semicircular or semi-elliptic. The stress applied to the conductive layer having the grooves is divided into a vertical component and a horizontal component with respect to the surface of the conductive layer. Accordingly, the stress applied vertically to the conductive layer is reduced, making it is possible to prevent the conductive layer from cracking due to stress and to reduce the stress transmitted to material layers under the conductive layer.

6 Claims, 9 Drawing Sheets

SEMICONDUCTOR DEVICE HAVING STRESS REDUCING LAMINATE AND METHOD FOR MANUFACTURING THE SAME

BACKGROUND OF THE INVENTION

1. Field of the Invention

The present invention relates to a semiconductor device and a method for manufacturing the same, and more particularly, to a semiconductor device having a stress reducing laminate and a method for manufacturing the same.

2. Description of the Related Art

As a semiconductor device becomes more highly integrated, the surface area allocated for the components which constitute the semiconductor device is reduced in size. Therefore, it is necessary to enlarge these allocated areas in the vertical direction in order to form normally operating semiconductor devices in the reduced size areas. Accordingly, the resulting semiconductor device has a multilayer structure. A multilayer pad film is a representative example of a multilayer structure.

A multilayer structure has more stress distribution compared with a single-layer structure. For example, upper and lower material films that make up the multilayer structures may have different thermal expansion coefficients, stresses, and densities, which contribute to the increased stress in the multilayer structure. Also, during the semiconductor device manufacturing process, the multilayer structure can be thermally shocked and stressed.

A multilayer structure according to a conventional technology and its resulting stress distribution will now be described.

Referring to the multilayer structure of FIG. 1, a first conductive layer 12 is formed on a substrate 10. A first interlayer dielectric film 14 is formed on the first conductive layer 12. A first via hole 16, through which the first conductive layer 12 is exposed, is formed in the first interlayer dielectric film 14. A second conductive layer 18 for filling the first via hole 16 is formed on the first interlayer dielectric film 14. A second interlayer dielectric film 20 is formed on the second conductive layer 18. A second via hole 22, through which the second conductive layer 18 is exposed, is formed in the second interlayer dielectric film 20. A third conductive layer 24 for filling the second via hole 22 is formed on the second interlayer dielectric film 20.

FIG. 2 is a plan view of the multilayer structure whose cross section, taken along the direction 1–1' of FIG. 2, is illustrated in FIG. 1. In FIG. 2 the first via hole 16 and the second via hole 22 are identified by dotted lines.

FIG. 3 is an enlarged view of a sample area 26 of FIG. 1, which illustrates the stress applied from upper layers to a lower layer in the multilayer structure as shown in FIG. 1. The stress (shown by the arrows) is applied vertically to the first conductive layer 12 by laminates formed on the first conductive layer 12, such as the first interlayer dielectric film 14, the second conductive layer 18, the second interlayer dielectric film 20, and the third conductive layer 24.

As is easily seen from the above discussion, for a semiconductor device having a multilayer laminated structure on a substrate according to the conventional technology, stress is applied vertically to the surface of an underlayer by laminates stacked on the underlayer, and this stress is further transmitted to the other material films underneath the underlayer. As a result, the other material films are more prone to cracking.

SUMMARY OF THE INVENTION

It is an object of the present invention to provide a semiconductor device having a multilayer laminated structure in which it is possible to prevent material films from cracking due to stress. This is achieved by dispersing the stress applied to the material films by the laminates formed on a material film and directing some of the stress to the side of the material film, thus reducing the stress that is applied vertically to the material films.

It is another object of the present invention to provide a method for manufacturing the above semiconductor device.

In order to achieve the first object, the present invention provides a semiconductor device including a stress reducing laminate, in which an interlayer dielectric film is formed on a substrate and conductive layer patterns are formed on the interlayer dielectric film. Grooves are formed on the surface of the conductive layer patterns, with the grooves having widths that are narrower than a distance between the conductive layer patterns. Preferably, the widths of the grooves are no more than ½ of the distance between the conductive layer patterns. The cross sections of the grooves along the width direction are semicircular or semi-elliptic in shape.

In another aspect of the present invention, there is provided a semiconductor device having a stress reducing laminate in which a plurality of conductive layers are sequentially formed on a substrate with interlayer dielectric films formed between the plurality of conductive layers. Via holes formed in the interlayer dielectric films expose certain regions of the underlying conductive layer, and the via holes are filled by the material of the overlying conductive layer. Grooves are formed on the surface of each of the plurality of conductive layers for dispersing the stress applied to the respective conductive layers, wherein the grooves are located between the regions exposed by the via holes.

In order to achieve the second object, there is provided a method for manufacturing a semiconductor device having a stress reducing laminate. The method includes: (a) forming an interlayer dielectric film on a substrate; (b) forming a first conductive layer on the interlayer dielectric film, wherein the first conductive layer is connected to the substrate through the interlayer dielectric film; and (c) forming first grooves on the first conductive layer.

After forming the first grooves, the method further includes: (d) forming a first interlayer dielectric film on the first conductive layer for filling the first grooves; (e) forming first via holes in the first interlayer dielectric film to expose regions of the first conductive layer between the first grooves on the first conductive layer; (f) forming a second conductive layer on the first interlayer dielectric film for filling the first via holes; (g) forming second grooves on the second conductive layer; (h) forming a second interlayer dielectric film on the second conductive layer for filling the second grooves; (i) forming second via holes in the second interlayer dielectric film to expose regions of the second conductive layer between the second grooves on the second conductive layer; and (j) forming a third conductive layer on the second interlayer dielectric film for filling the second via holes.

Grooves are formed on the surface of the conductive layer patterns, with the grooves having widths that are narrower than a distance between conductive layer patterns. Preferably, the widths of the grooves are no more than ½ of the distance between the conductive layer patterns. The cross sectional shape of the grooves along the width direction are semicircular or semi-elliptic.

As a result, the stress applied to the groove is dispersed along components that are vertical and horizontal to the conductive layer surface, which reduces the stress applied vertically to the conductive layer. Therefore, it is possible to prevent the conductive layer from cracking due to stress and to reduce the stress transmitted to the material layers under the conductive layer. Also, since the area in which the material layer contacting the conductive layer is larger in the grooves formed on the conductive layer, the adhesive strength between the conductive layer and the material layer increases.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
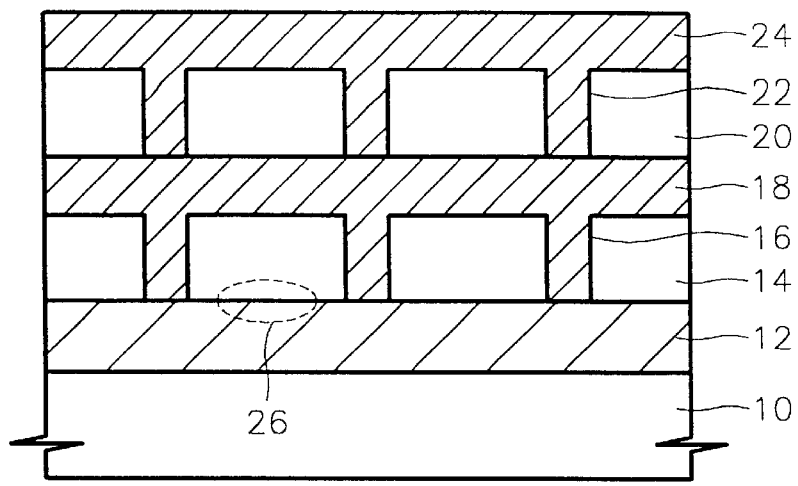
FIGS. 1 and 2 are respectively a sectional view and a plan view of a semiconductor device having a multilayer laminated structure according to a conventional technology.
Figure 2:
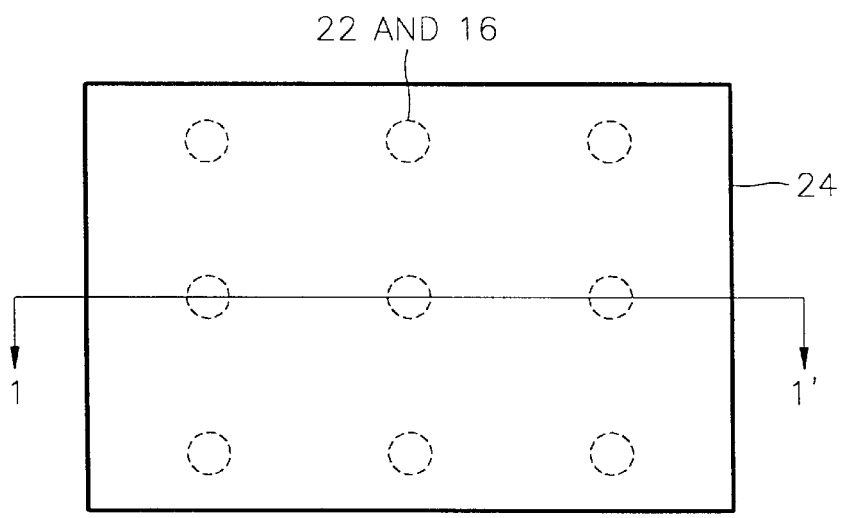
Figure 3:
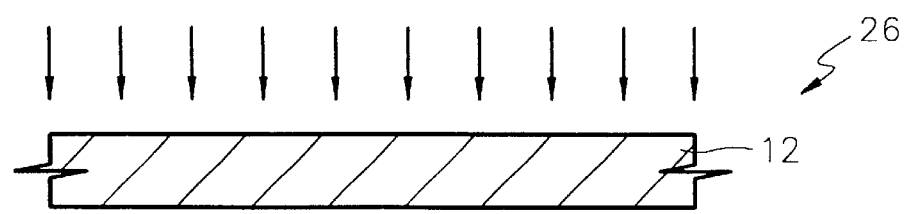
FIG. 3 is a sectional view showing the direction in which stress is applied to a conductive layer of the semiconductor device shown in FIG. 1.

Hereinafter, a semiconductor device having a stress reducing laminate of a multilayer structure on a substrate according to embodiments of the present invention, and a method for manufacturing the same, will be described in detail with reference to the attached drawings. The embodiments of the present invention are provided in order to more completely describe the present invention to anyone skilled in the art. However, the embodiments of the present invention have many variations and the scope of the present invention is not restricted to the following illustrated embodiments.

In the drawings, the thicknesses of layers and areas are exaggerated for the sake of clarity. The same reference numerals or letters denote the same elements. Also, when a certain layer is described to be on another layer or substrate, the certain layer may be disposed directly on another layer or substrate, or a third layer may be interposed between the certain layer and the another layer or substrate.

First, after describing a semiconductor device having a stress reducing laminate of a multilayer structure on a substrate according to a first embodiment of the present invention, a method for manufacturing the same will be described.

Figure 4:
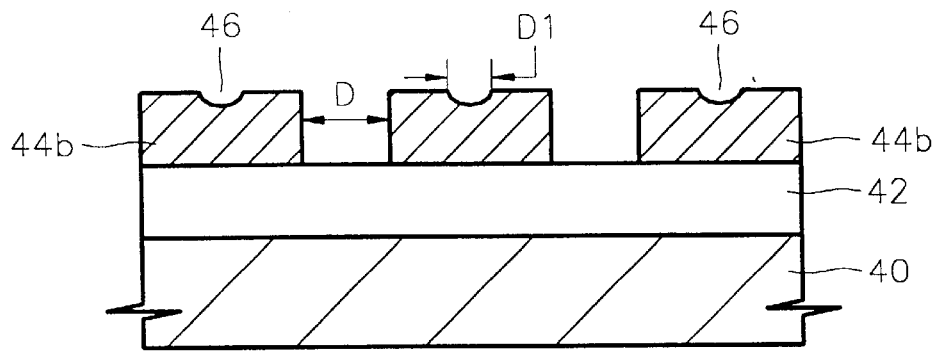
FIG. 4 is a sectional view of a semiconductor device having a stress reducing laminate according to a first embodiment of the present invention.

Referring to FIG. 4, an interlayer dielectric film 42 is formed on a substrate 40. The substrate 40 may be a semiconductor substrate, a silicon on insulator (SOI) substrate, or other suitable substrate. Conductive layer patterns 44b are formed on the interlayer dielectric film 42. The conductive layer patterns 44b are separated from each other by a predetermined distance D, and grooves 46 are formed on the conductive layer patterns 44b. The width D1 of the groove 46 is narrower than the distance D between the conductive layer patterns 44b. Preferably, the width D1 of the grooves are no more than ½ of the distance D between the conductive layer patterns 44b. Reference numeral 42a designates a representative contact hole (only one is shown for simplicity) formed in the interlayer dielectric film 42, through which the conductive layer patterns 44b are connected to the substrate 40. The conductive layer patterns 44b are preferably formed of aluminum, although other suitable conductive materials may be employed.

A material layer filling the grooves 46 may be disposed on the conductive layer patterns 44b. Although the conductive layer patterns 44b are mechanically stressed by the material layer, and thermally stressed due to a difference in thermal expansion coefficients applied during a process of forming the material layer, the grooves 46 formed in the conductive layer patterns 44b serve to reduce the load applied on the conductive layer patterns 44b by dispersing the vertical stress applied to the conductive layer patterns 44b. The grooves 46 preferably have curved surfaces rather than having planar surfaces which vertically meet the surface of the conductive layer patterns 44b. For example, the grooves 46 exhibit a curved surface profile whereby the grooves are deepest in the center and are shallowest at the edges. The cross section of the groove 46 along its short dimension (i.e., its width) is preferably semicircular or semi-elliptic. Accordingly, the stress applied to the conductive layer patterns 44b contains components that are vertical and horizontal to the surface of the conductive layer patterns 44b. As a result, the stress component applied vertically to the conductive layer pattern 44b is reduced, and the stress load applied to the conductive layer patterns 44b is reduced.

Now, a method for manufacturing the semiconductor device including the stress reducing laminate according to the first embodiment will be described.

Figure 5:
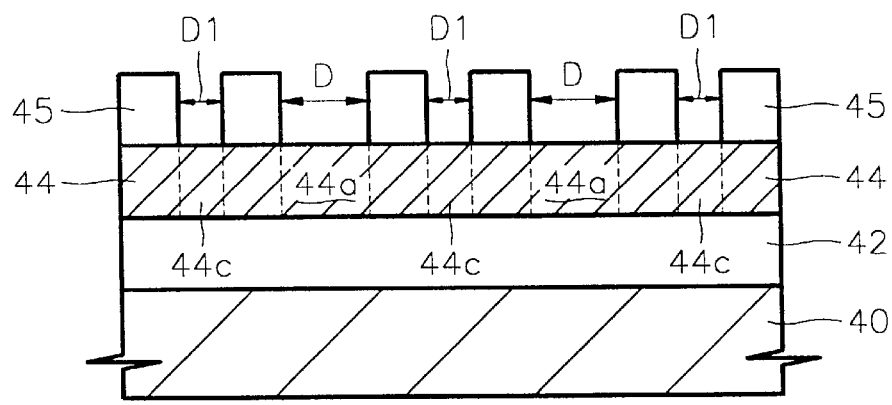
FIGS. 5 and 6 illustrate the steps of a method for manufacturing a semiconductor device having the stress reducing laminate according to the first embodiment of the present invention.

Referring to FIG. 5, the interlayer dielectric film 42 is formed on the substrate 40. The substrate 40 is preferably formed of a semiconductor substrate. However, it can be formed of another substrate such as the SOI substrate. A conductive layer 44 connected to the substrate 40 is formed on the interlayer dielectric film 42. The conductive layer 44 is preferably formed of an aluminum layer. A photosensitive film (not shown) is coated on the conductive layer 44. A photosensitive film pattern 45 is formed, through which first areas 44a of the conductive layer 44 and second areas 44c between the first areas 44a of the conductive layer 44 are exposed. The first areas 44a are removed in the subsequent etching process. However, only some of the upper area of the second areas 44c are removed. This is because the distance D between the photosensitive film patterns 45 through which the first areas 44a are exposed, are wider than distance D1 between the photosensitive film patterns 45 for exposing the second areas 44c.

In other words, when forming the photosensitive film pattern 45, a design rule used for exposing the second areas 44c is preferably no more than ½ of the design rule applied for exposing the first areas 44a. The design rule for exposing the second areas 44c corresponds to a minimum design rule by which it is possible to completely remove the first areas 44a of the conductive layer 44 in the subsequent etching process. Accordingly, the second areas 44c are not completely removed in the subsequent etching process but some of the upper portion is removed.

Figure 6:
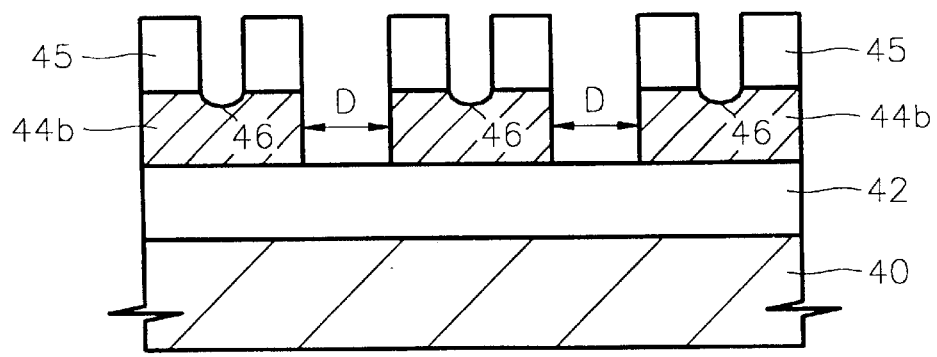

In order to confirm this, the exposed entire surface of the conductive layer 44 is anisotropically etched using the photosensitive film pattern 45 as an etching mask. The anisotropic etching is performed until the interlayer dielectric film 42 is exposed. As a result, as shown in FIG. 6, the first areas 44a of the conductive layer 44 are completely removed. Accordingly, the certain regions of the interlayer dielectric film 42 are exposed, and the conductive film patterns 44b are formed, which patterns 44b are separated from each other by a distance "D". Also, grooves 46 are formed in the second areas 44c by removing some of the upper areas.

As mentioned above, the grooves 46 are formed in order to reduce the stress load applied vertically to the conductive layer patterns 44b by dispersing the stress applied to the conductive layer patterns 44b in various directions. Therefore, the grooves 46 are preferably formed to be concave so that they are deepest in the center and shallowest at the edge. The cross section of the groove 46 along its short dimension (i.e., its width) is preferably semicircular or semi-elliptic.

In the first embodiment of the present invention, the stress reducing aspects of the invention are applied to a simple conductive layer pattern formed on the interlayer dielectric film by forming the grooves in the conductive layer pattern as described above.

A second embodiment of the present invention will now be described, in which a semiconductor device including a stress reducing laminate is applied to a multilayer pad and a method for manufacturing the same.

Figure 7:
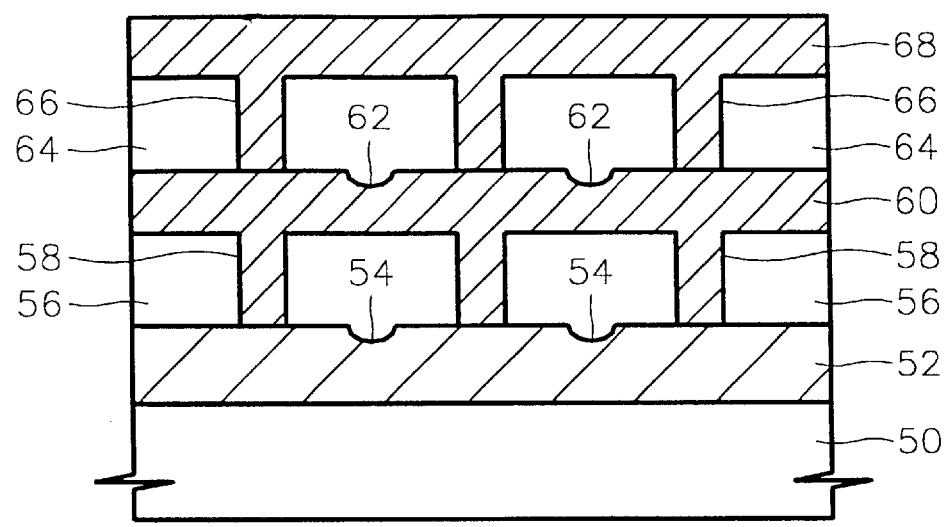
FIGS. 7 and 8 are respectively a sectional view and a plan view of a semiconductor device having a stress reducing laminate according to a second embodiment of the present invention.

Referring to FIG. 7, the semiconductor device including the stress reducing laminate according to the second embodiment of the present invention is comprised of a substrate 50, such as a semiconductor substrate or an SOI substrate, and a first conductive layer 52 formed on the substrate 50. The first conductive layer 52 is preferably an aluminum layer although other suitable conductive materials may be utilized. Concave first grooves 54 are formed on the surface of the first conductive layer 52. The first grooves 54 are formed in predetermined areas of the first conductive layer 52. A first interlayer dielectric film 56, for filling the first grooves 54, is formed on the first conductive layer 52. The first interlayer dielectric film 56 may be, for example, a silicon oxide film. First via holes 58 are formed in the first interlayer dielectric film 56, through which regions of the surface of the first conductive layer 52 between the first grooves 54 are exposed. A second conductive layer 60 for filling the first via holes 58 is formed on the first interlayer dielectric film 56. The first conductive layer 60 is preferably formed of a conductive material layer identical to the first conductive layer 52 although it may be formed of other conductive materials. Second grooves 62 are formed on the surface of the second conductive layer 60. Preferably, the second grooves 62 are formed at surface positions corresponding to the first grooves 54, such that they are vertically aligned as shown in FIG. 7, although the second grooves 62 may be formed at any position on the second conductive layer 60. A second interlayer dielectric film 64 for filling the second grooves 62 is formed on the second conductive layer 60. The second interlayer dielectric film 64 is preferably formed of an insulating material film identical to the first interlayer dielectric film 56, but it may be formed of other insulating material films. Second via holes 66, through which regions of the second conductive layer 60 are exposed, are formed in the second interlayer dielectric film 64. The second via holes 66 are formed so as to expose regions of the second conductive layer 60 between the second grooves 62. The second via holes 66 are preferably formed so as to be aligned vertically with the first via holes 58, although the second via holes 66 may be positioned anywhere between the second grooves 62.

For example, the positions of the second via holes 66 and the positions of the second grooves 62 may be switched. Any area of the second conductive layer 60 may be exposed by the second via holes 66, excluding the area in which the second grooves 62 are formed. Likewise, any area of the first conductive layer 52 may be exposed by the first via holes 58, excluding the area in which the first grooves 54 are formed.

A third conductive layer 68 for filling the second via holes 66 is formed on the second interlayer dielectric film 64. The third conductive layer 68 is preferably formed of the same conductive material layer as the first and second conductive layers 52 and 60, but it may be formed of other conductive material layers. The surface of the third conductive layer 68 is planarized, and thereafter, third grooves (not shown) may be formed in the third conductive layer 68. A third interlayer dielectric film and a fourth conductive layer may be further sequentially formed on the third conductive layer 68.

The number of conductive layers and the interlayer dielectric films constituting the multilayer pad shown in FIG. 7 can be increased or decreased according to the function and purpose of the semiconductor device.

Figure 8:
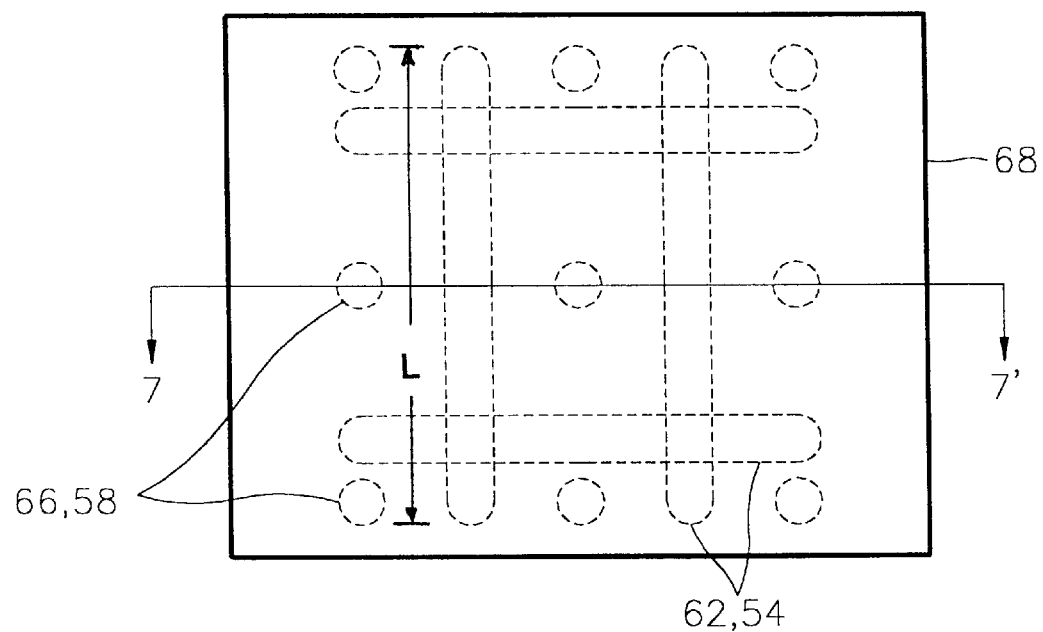

FIG. 8 is a plan view of FIG. 7 illustrating a third conductive layer 68 formed as the top layer as described above. FIG. 7 is a sectional view taken along the direction 7-7' of FIG. 8. In FIG. 8, the first and second grooves 54 and 62 and the first and second via holes 58 and 66 are all marked with dotted lines to show that they are not directly exposed since they are formed under the third conductive layer 68.

Referring to FIG. 8, the first and second grooves 54 and 62 are formed to have a certain length L along the surface of the conductive layer. Also, additional first grooves 54 and second grooves 62 may be formed in the respective conductive layers 52 and 60 so as to perpendicularly cross the existing first grooves 54 and the second grooves 62 as shown in FIG. 8. The crossing of the respective grooves 54 and 62 create defined regions in the conductive layer which are thereafter exposed through the first via holes 58 and the second via holes 66. Preferably, the first via holes 58 and the second via holes 66 are arranged between the first grooves 54 and the second grooves 62, and more preferably, are centrally arranged between the first grooves 54 and the second grooves 62.

The method for manufacturing the semiconductor device including the stress reducing laminate according to the second embodiment of the present invention will now be described in detail.

Figure 9A:
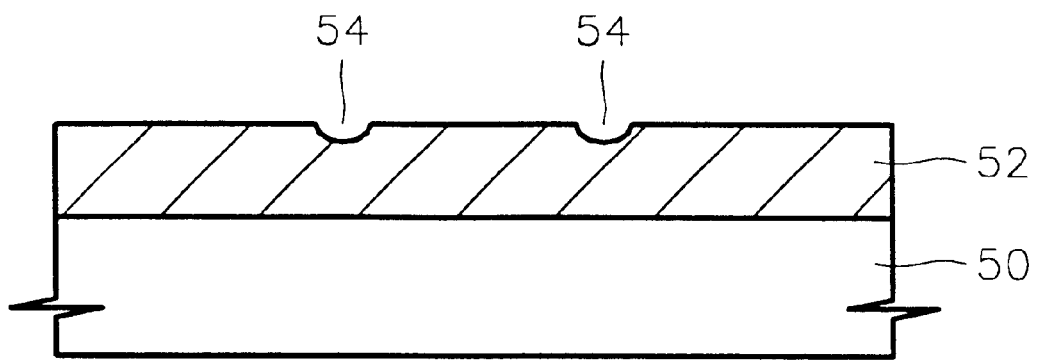
FIGS. 9(a) through 13(b) illustrate the steps of a method for manufacturing the semiconductor device having the stress reducing laminate according to the second embodiment of the present invention.
Figure 9B:
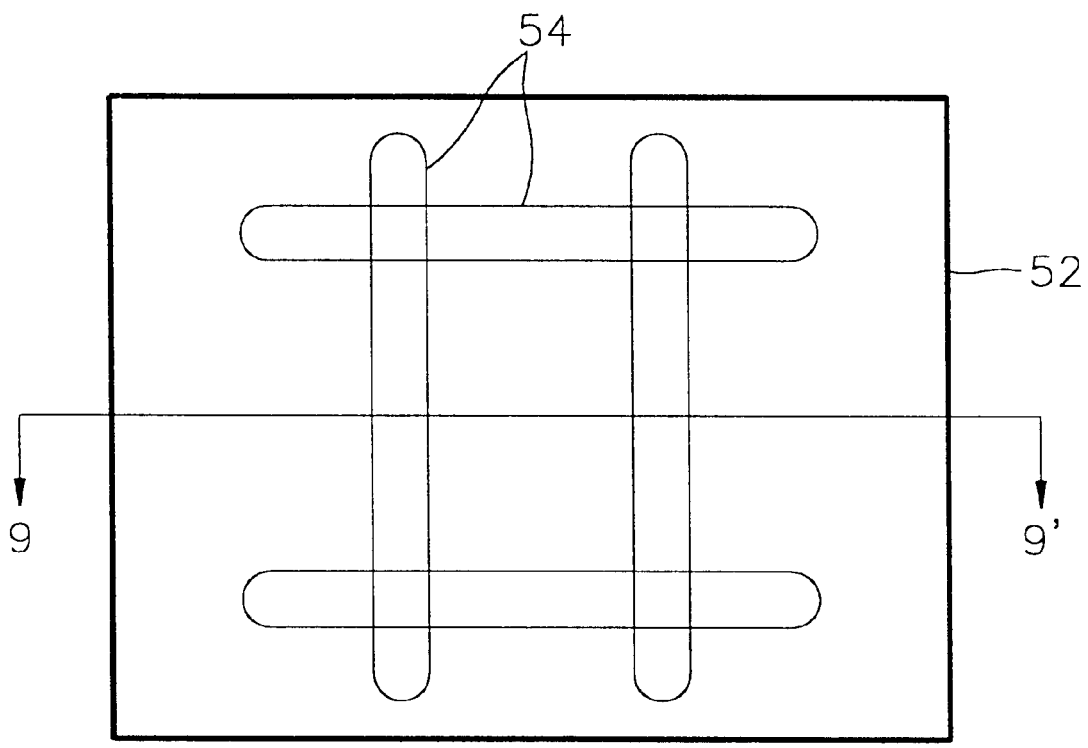

Referring to FIG. 9(a), a first conductive layer 52 is formed on a substrate 50. Concave first grooves 54 are formed on the surface of the first conductive layer 52 in the same manner as the grooves 46 of the first embodiment of the present invention (see FIG. 6), and have the same characteristics as the grooves 46, including the semicircular or semi-elliptic cross section. As shown in FIG. 9(b), another plurality of first grooves 54 are formed on the surface of the first conductive layer 52 to perpendicularly cross the existing first grooves 54.

Figure 10A:
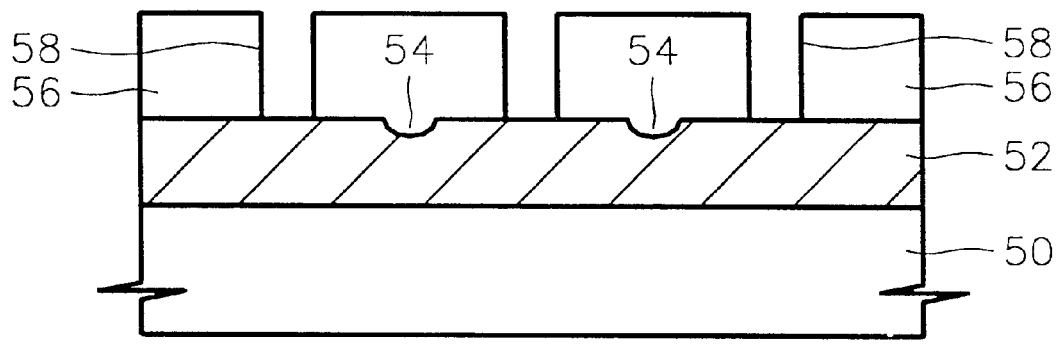
Figure 10B:
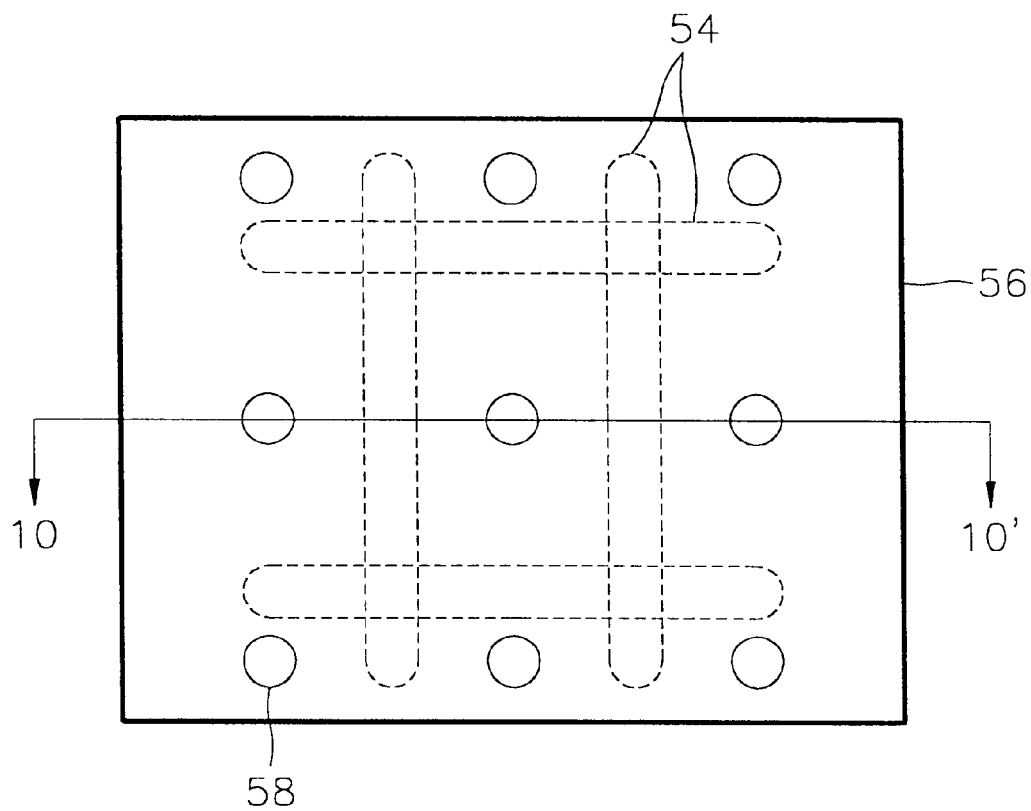

FIG. 10(a) is a sectional view taken along the direction 10–10' of the plan view of FIG. 10(b). Referring to FIG. 10(a), a first interlayer dielectric film 56 for filling the first grooves 54 is formed on the first conductive layer 52. First via holes 58, through which regions of the first conductive layer 52 are exposed, are formed in the first interlayer dielectric film 56. Referring to FIG. 10(b), it is preferable that the first via holes 58 are formed so as to expose the regions of the first conductive layer 52 between the first grooves 54. Most preferably, the first via holes 58 are formed so as to expose the center of the regions of the first conductive layer 52 between the first grooves 54.

Figure 11A:
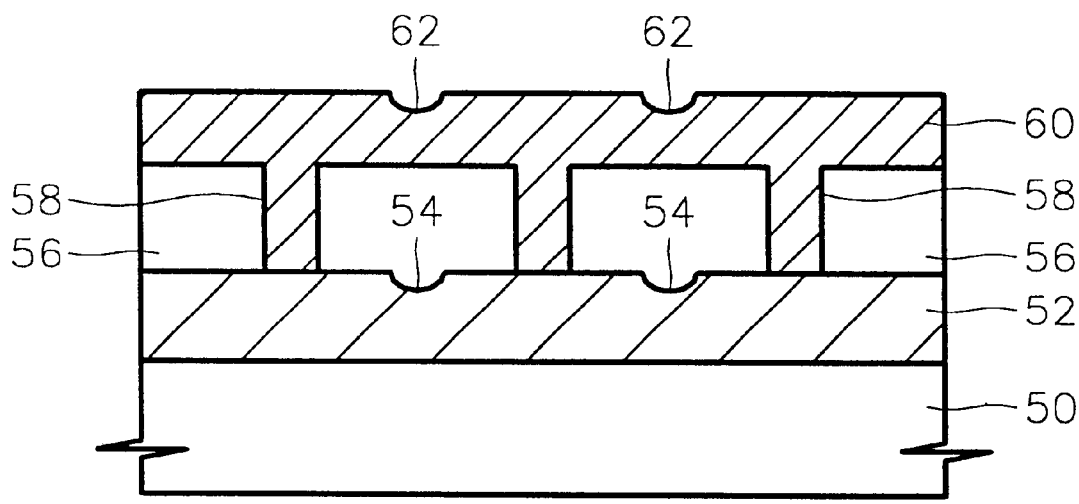
Figure 11B:
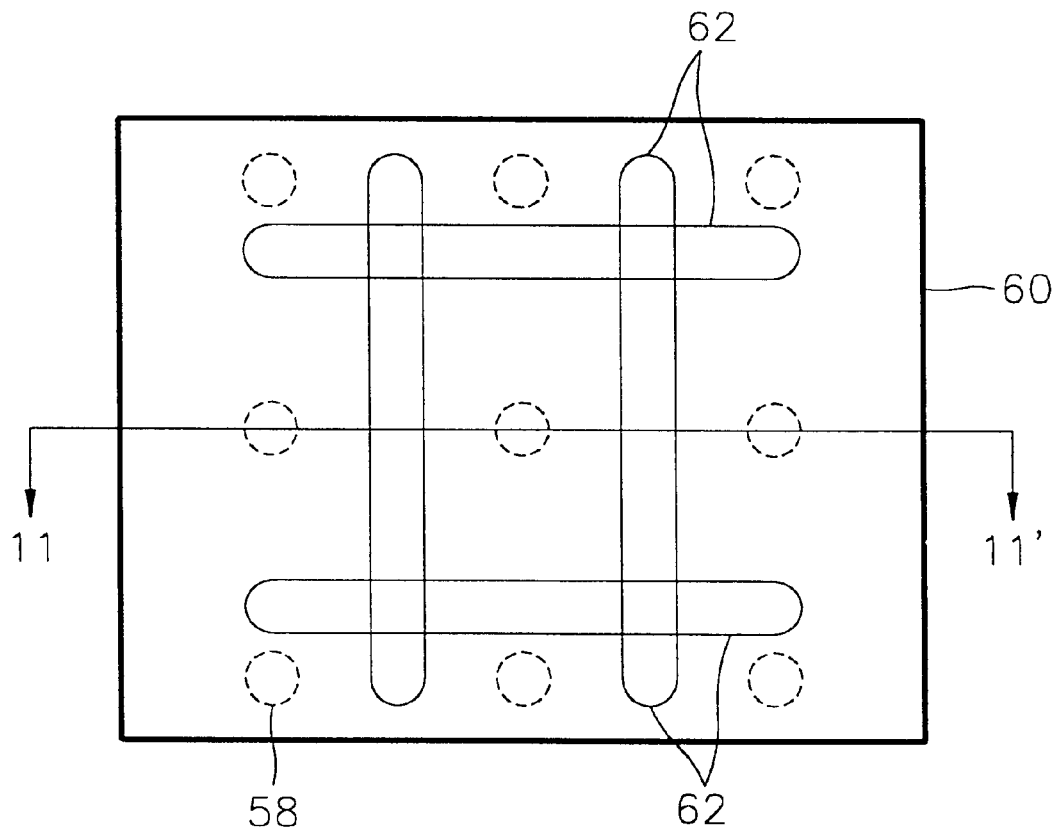

FIG. 11(a) is a sectional view taken along the direction 11–11' of the plan view of FIG. 11(b). Referring to FIG. 11(a), a second conductive layer 60 for filling the first via holes 58 is formed on the first interlayer dielectric film 56. Second grooves 62 are formed on the surface of the second conductive layer 60 by the same method as the method by which the first grooves 54 are formed on the first conductive layer 52, and the second grooves 62 have the same characteristics as the first grooves 54, including the semicircular or semi-elliptic cross section. The second grooves 62 may be formed in any positions on the second conductive layer 60. For example, the second grooves 62 may be formed in the locations directly above the first via holes 58, or they may be formed in the locations that are vertically aligned with the first grooves 54. Referring to FIG. 11(b), the plurality of second grooves 62 are formed to have a predetermined length along the surface of the second conductive layer 60 and to perpendicularly cross one another.

Figure 12A:
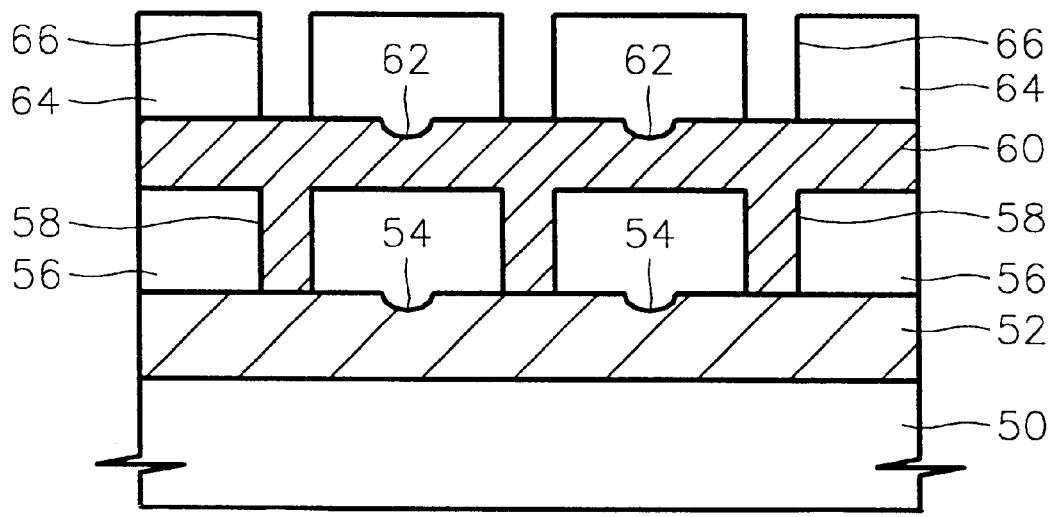
Figure 12B:
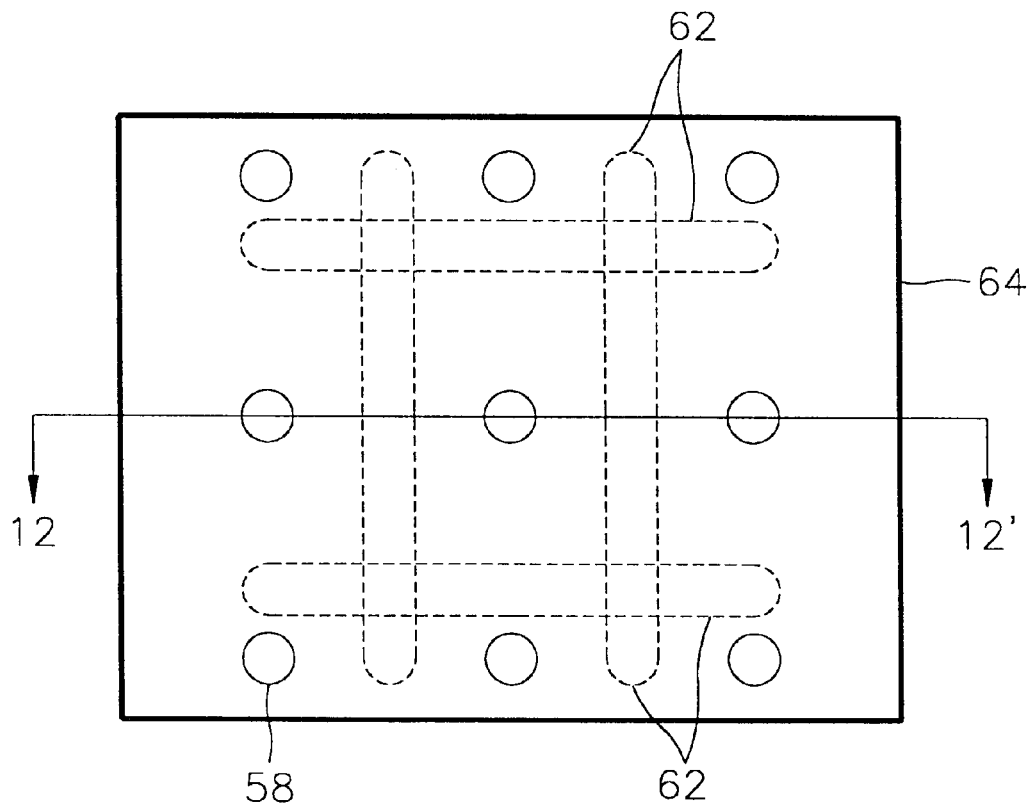

FIG. 12(a) is a sectional view taken along the direction 12–12' of the plan view of FIG. 12(b). Referring to FIG. 12(a), a second interlayer dielectric film 64 for filling the second grooves 62 is formed on the second conductive layer 60. Second via holes 66, through which regions of the second conductive layer 60 are exposed, are formed in the second interlayer dielectric film 64. The second via holes 66 expose regions of the second conductive layer 60 between the second grooves 62. As shown in this embodiment, the regions of the second conductive layer 60 directly above the first via holes 58 are exposed through the second via holes 66. In other words, the first and second via holes 58 and 66 are vertically aligned. However, the regions of the second conductive layer 60 exposed through the second via holes 66 are not limited to those portions directly above the first via holes 58, but rather may be positioned anywhere on the second conductive layer 60 between the second grooves 62.

Figure 13A:
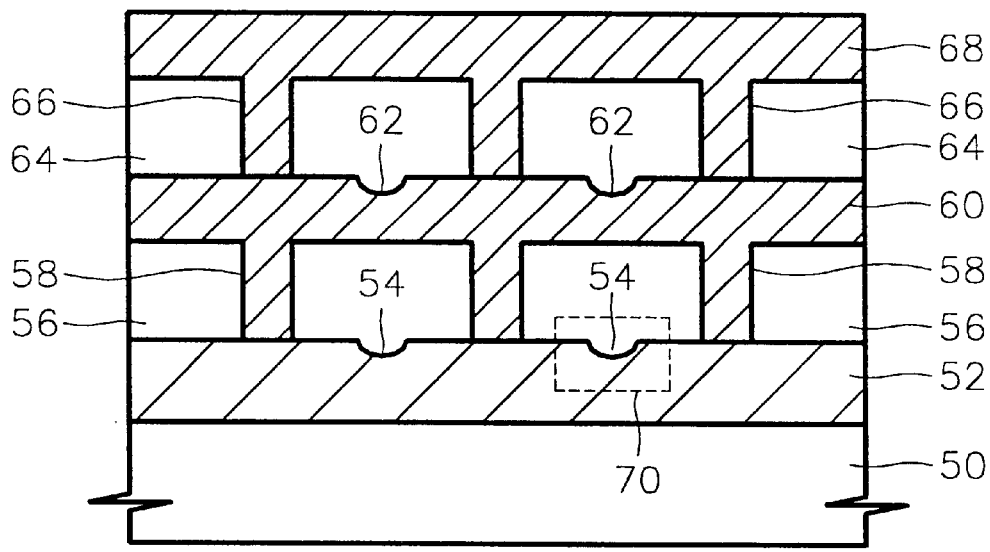
Figure 13B:
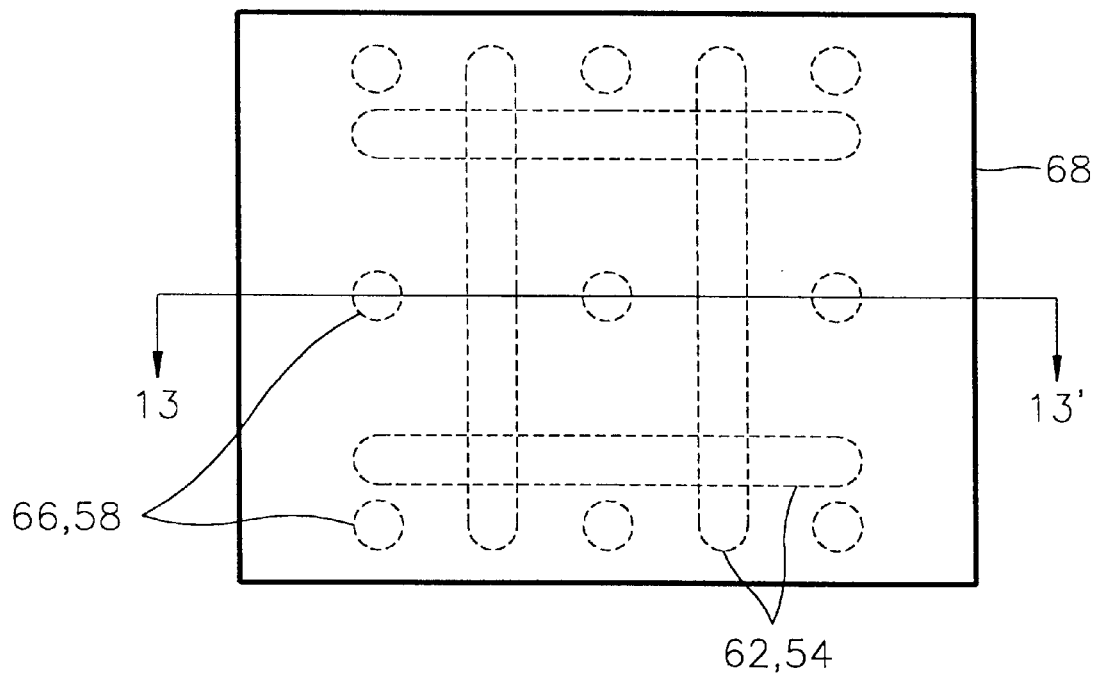

FIG. 13(a) is a sectional view taken along the direction 13–13' of the plan view of FIG. 13(b). Referring to FIG. 13(a), a third conductive layer 68 for filling the second via holes 66 is formed on the second interlayer dielectric film 64, after which the entire surface of the third conductive layer 68 is planarized. The third conductive layer 68 is preferably formed of the same material layer as the first conductive layer 52 and the second conductive layer 60.

In the second embodiment of the present invention, the stress applied to the respective conductive layers is dispersed in various directions, i.e., the directions vertical and horizontal to the surface of the conductive layer, by forming grooves on the surfaces of the sequentially stacked conductive layers constituting the multilayer pad while forming the multilayer pad. As a result, the vertical load caused by the stress applied to the conductive layers of the multilayer pad is reduced, thereby preventing the conductive layers from cracking. Accordingly, it is possible to attain a multilayer pad having a wide area which does not crack.

Also, since the area in which the material layer contacting the conductive layer becomes larger due to the grooves, the conductive layer more easily adheres to the material layer.

Figure 14:
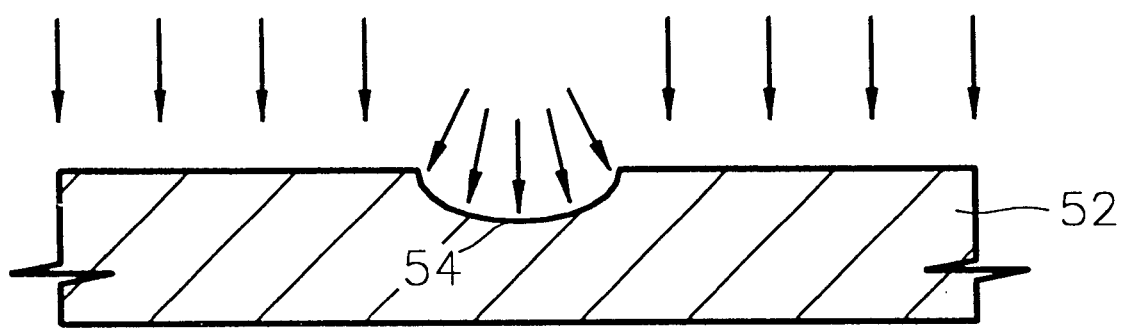
FIG. 14 is a sectional view showing the direction in which the stress is applied in a semiconductor device having a stress reducing laminate according to the embodiments of the present invention.

The dispersion effect of the stress applied to the conductive layers, obtained by the grooves formed on the surfaces of the conductive layers will now be described with reference to FIG. 14, which shows the distribution of stress applied to a sample area 70 in FIG. 13(a).

The degree of stress dispersion applied to the grooves 54 of the first conductive layer 52 is different than the degree of stress dispersion applied to flat portions of the first conductive layer 52. The stress vertically applied to the flat surface of the first conductive layer 52 is directly transmitted to the material layers formed under the first conductive layer 52 as well as the first conductive layer 52.

However, the stress applied to the grooves 54 of the first conductive layer 52 is dispersed in various directions, for example, the directions vertical and horizontal to the surface of the first conductive layer 52. As a result, it is possible to reduce the stress applied vertically to the surface of the first conductive layer 52, and the stress transmitted to the material layers formed under the first conductive layer 52, by forming the grooves 54 on the surface of the first conductive layer 52.

As one example, the mechanical stress applied to the multilayer pad during wire bonding can be dispersed in various directions by forming grooves in the conductive layers constituting the multilayer pad. Therefore, it is possible to prevent the multilayer pad from cracking due to mechanical stress.

Although the present invention has been illustrated and described above with respect to specific embodiments, various modifications and alterations of these embodiments will become apparent to those skilled in the art. For example, the shape of grooves may be altered, the grooves may be arranged in a different pattern, the arrangement of the grooves and the via holes may be different, and more than one via hole may be formed in the regions defined by the arrangement of the grooves. Moreover, the grooves may be formed in any of the layers of the multilayered structure, not just the conductive layers. Therefore, all such alterations and modifications are seen to be within the true spirit and scope of the invention as defined by the appended claims.

What is claimed is:

1. A semiconductor device comprising:

a substrate;

an interlayer film disposed on said substrate;

a plurality of conductive layer patterns disposed on the interlayer dielectric film, said patterns being horizontally spaced apart from one another on the interlayer dielectric film; and the conductive layer patterns having grooves therein at the upper surfaces thereof, the grooves being elongate in a direction perpendicular to the direction in which said conductive layer patterns are horizontally spaced apart from one another on the interlayer dielectric film, and wherein the grooves have widths that are narrower than a distance by which adjacent ones of the conductive layer patterns are horizontally spaced apart from one another.

2. The semiconductor device of claim 1, wherein a cross sectional shape of the grooves, with reference to a width direction of the grooves, is one of semicircular and semi-elliptic.

3. The semiconductor device of claim 1, wherein the widths of the grooves are no more than ½ of the distance between the conductive layer patterns.

4. A semiconductor device comprising:

a substrate;

a plurality of conductive layers disposed vertically one above the other on said substrate;

a plurality of interlayer dielectric films, each of the interlayer dielectric films being interposed between successive ones of the plurality of conductive layers so as to lie directly on one of the conductive layers, and the dielectric films having via holes filled by conductive material constituting a respective one of the conductive layers that is disposed thereabove; and each of the conductive layers, that has one of the dielectric films disposed directly thereon, having elongate grooves therein at the upper surface thereof, and wherein the grooves are disposed at locations spaced horizontally from the locations of the via holes in the interlayer dielectric film disposed directly thereunder.

5. The semiconductor device of claim 4, wherein a cross sectional shape of the grooves, with reference to a width direction of the grooves, is one of semicircular and semi-elliptic.

6. The semiconductor device of claim 4, wherein the grooves in each of the plurality of conductive layers extend longitudinally perpendicular to each other.

* * * * *